United States Patent [19]
Svensson

[11] 4,099,174
[45] Jul. 4, 1978

[54] LOGARITHMIC DIGITAL TO ANALOG CONVERTER

[75] Inventor: Lars Tommy Edvard Svensson, Skarholmen, Sweden

[73] Assignee: Telefonaktiebolaget L M Ericsson, Stockholm, Sweden

[21] Appl. No.: 719,508

[22] Filed: Sep. 1, 1976

[30] Foreign Application Priority Data

Sep. 26, 1975 [SE] Sweden .................................. 7510801

[51] Int. Cl.² .......................................... H03K 13/02
[52] U.S. Cl. .......................................... 340/347 DA
[58] Field of Search .... 340/347 M, 347 AD, 347 DA

[56] References Cited

U.S. PATENT DOCUMENTS

| | | | |
|---|---|---|---|
| 3,303,489 | 2/1967 | Krucoff | 340/347 DA |
| 3,573,795 | 4/1971 | Bowers | 340/347 DA |
| 3,705,359 | 12/1972 | Kappes | 340/347 AD |
| 3,906,489 | 8/1975 | Schlichte | 340/347 DA |

*Primary Examiner*—Charles D. Miller
*Attorney, Agent, or Firm*—Hane, Roberts, Spiecens & Cohen

[57] ABSTRACT

A converter has a ladder network of resistor means for converting binary words to amplitude values according to an expansion curve. One of the transverse resistor means of the ladder network comprises a resistor chain, each terminal of which is connected through one of a set of first switches to the output of the converter. Each of the nodes of the ladder network is connected through one of a set of second switches to one reference voltage. The first and second switches are activated in response to interval- and segment-identity signals, respectively. Each conversion is carried out by generating an actual combination comprising one interval- and one segment-identity signal, and, consequently, by switching one of the first and one of the second switches.

3 Claims, 5 Drawing Figures

LOGARITHMIC DIGITAL TO ANALOG CONVERTER

The present invention relates to a digital to analog converter for converting binary words to amplitude values between a negative and a positive maximum potential according to an expansion curve which consists of continuous substantially linear segment, containing equally divided intervals. The bit positions in the binary words indicate the polarity and the segment- and interval-identity of the amplitude value. The converter also contains a register for storing received binary words to be connected and a reference potential source to supply reference potentials necessary for the conversion.

As expansion curves used in PCM-codec-equipments, CCITT (Comite Consultatife International Telephonique) has recommended a so called A and $\mu$-law, according to CCITT.REc.G.711-5378/79 and 5380/81, respectively. Common for both laws is that the binary words which are to be converted to amplitude values consist of $p + m + n$ bits with determined positions, whereby $p = 1$, $m = 3$ and $n = 4$, and that the highest amplitude values are obtained for continuous linear segments, where the drop is doubled ($e = 2$) for subsequent segments and where each segment consists of $2^n$ equally divided intervals. The positions provided for said $p$, $m$ and $n$ bits state the polarity, segment- and interval-identity, respectively, of the amplitude value. According to the A-law, $r$ is equal to 6 and the lowest amplitude values are obtained by a further seventh segment, the drop of which is according to the doubling rule, but which consists of $2^{n+1}$ intervals. Because $m = 3$, it is possible to state $2^3$ segment identities. In the A-law, two of the segment identities are used in combination with $2^n$ possible interval identities, in order to state such further segment and its $2^{n+1}$ intervals. According to the $\mu$-law, $r$ is equal to 7 and the lowest amplitude values are obtained by a further eighth segment which also consists of $2^n$ intervals, but contains two different drops according to the doubling-law, one of which concerns the interval for the lowest amplitude value and the other of which concerns the other $2^{n-1}$ intervals of this further segment. Disregarding the small non linearity due to such two different drops, the $\mu$-law defines a complete homogeneous curve with an expansion factor $e = 2$.

It appears, for example, from an article "Integrated Circuits and Pulse Coding Means New Gains for Telephone" which was published in the periodical "Electronics" Sept. 19, 1966, and from the published Swedish patent applications Nos. 7409928-4 and 7412298-7, that such digital to analog converters are used in PCM-communication systems not only for demodulating of PCM-signals in order to generate analog signals, but also for modulating analog signals in order to generate PCM-signals. In this case, the PCM-coder is provided with a feedback including a digital to analog converter to compare a demodulated PCM-word with the analog input signal. A successive approximation is carried out to obtain equality between the input and demodulation signal by means of as few comparisons as possible. To use the same digital to analog converter equipment both upon modulation and demodulation guarantees that the compression inserted on the sender side of a system corresponds exactly to the expansion inserted on the receiver side. The more PCM-communication systems extend towards the actual subscriber stations, the larger the number of Codec equipments and the more the quality of the system depends on the tolerances allowed for mass-production of the digital to analog converter arranged for example in digital telephone apparatuses.

The above-mentioned publications show digital to analog converters in which the expansion, for example, is achieved by means of a digital-digital expandor and which comprise a linear digital to analog converter. Linear digital to analog conversion is, in a known manner, obtained by, for example, a R-2R resistor ladder wherein constant currents are supplied to as many of its inputs as the respective PCM-word contains a determined binary value, for example binary "1". Linear digital to analog conversion is obtained in a likewise known manner by a ramp coder. Steps lead up along a linear amplitude value ramp until the step number is equal to the binary word. Said publications state that the expensive digital-digital expandor can be avoided with ramp segments whose drops correspond to the expansion curve, the different drops being obtained with different stepping rates or with different reference voltages for the amplitude value change per interval valid for the respective segment.

To sum up, the drawback with the known devices is that they need at least one reference voltage per segment, that they comprise switches whose internal impedance influences the conversion result, that they, due to the climbing process, are too slow to be used for successive approximations, and that they above all are quite unsuitable for a LSI (Large Scale Integration) technique of mass-production.

The present invention, the characteristics of which appear from the following claims, avoids such drawbacks. To carry out, for example, a conversion according to the A-law only one reference voltage is used which is always equally loaded. All $2^{n+m}$ digital to analog conversions are achieved in the manner that only two switches are switched per conversion. The internal impedance of the switches does not significantly influence the amplitude value result which is obtained directly, i.e. without the climbing process. The converter according to the invention incudes as a main part a resistor ladder network connected to switch groups the ladder network switches being very well suited for a LSI mass-production.

The converter according to the invention will now be described with reference to the accompanying drawings.

Figure 1:
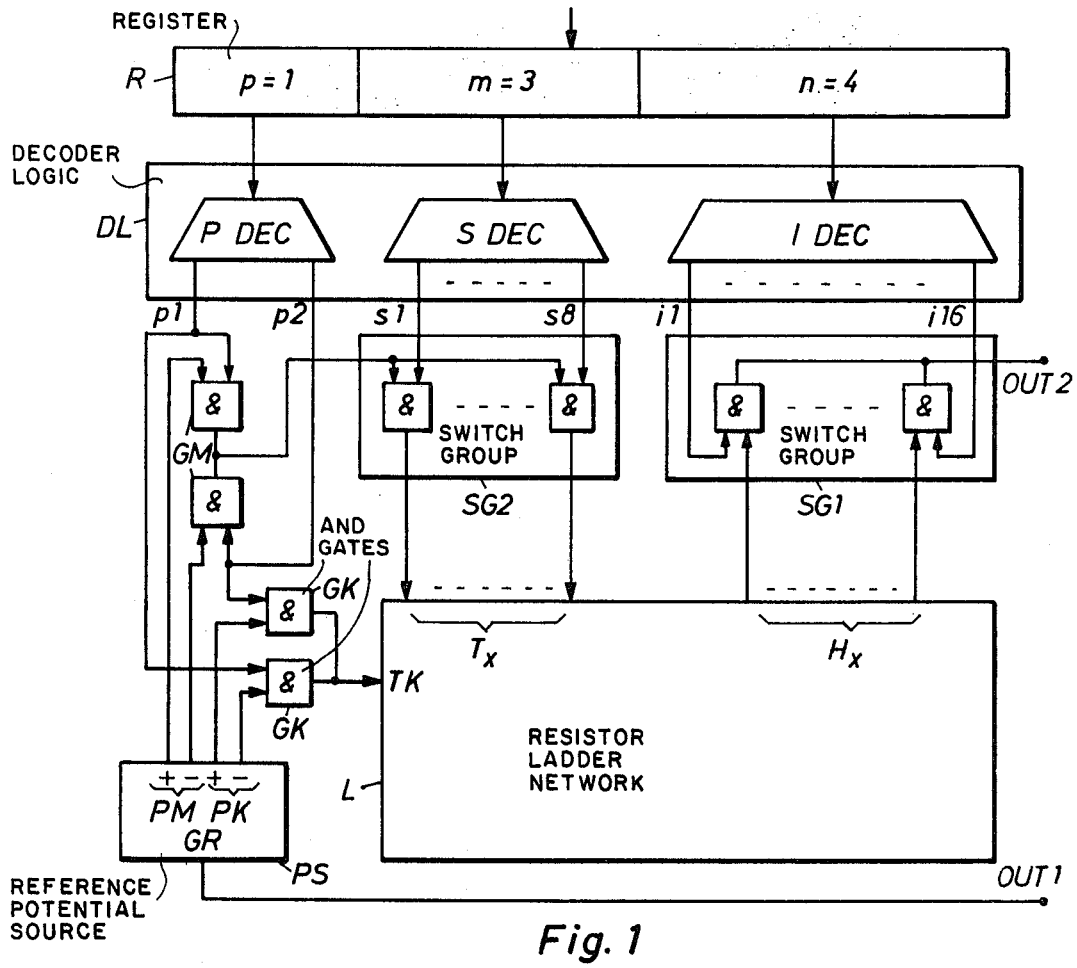
FIG. 1 shows the block circuit of the converter according to the invention.

In FIG. 1 a register R for the storage of the binary words to be connected has its output connected to a decoding logic DL. The expansion curve under consideration is homogeneous or according to the $\mu$-law so that the decoding logic consists of three decoders PDEC, SDEC and IDEC, connected to the $p$, $m$ and $n$ fields of the register and which per word generate one of two polarity signals $p_1$ and $p_2$, one of $2^m$ segment identity signals $s_1$ to $s_8$ and one of the $2^n$ interval identity signals $i_1$ to $i_{16}$, where increasing number designations in the identity signals are presumed to belong to increasing amplitude values according to the curve. If the expansion curve is according to the A-law, the decoding logic is provided with 7 outputs for the segment-identity signals and with 32 outputs for the interval-identity signals, as will be described in connection with FIGS. 4 and 5.

A reference potential source PS supplies: on its output GR a ground potential which is transferred to the first output OUT1 of the converter, and supplies on its outputs PM equal amplitude positive and negative maximum voltage potentials to achieve a digital to analog conversion which is symmetrical in relation to the ground potential. In a homogeneous or a μ-law curve the reference potential source supplies on its outputs PK a positive and a negative compensation potential which is transferred via a first gate pair GK to an input TK of a resistor ladder network L described more in detail below. The compensation potential differs somewhat from the ground potential as will hereinafter be described. The polarity signals $p1$ and $p2$ activate the first gate pair GK and a second gate pair GM so that either the positive maximum potential together with the negative compensation potential or the negative maximum potential together with the positive compensation potential is transferred to the resistor ladder network. In an A-law curve the compensation potential is replaced by the ground potential, therefore in such case no first gate pair GK is needed.

Each of the interval- and segment-identity signals $s1$ to $s8$ and $i1$ to $i8$ activates a switch in a first and second switch group SG1, SG2, respectively, which switches are symbolized in FIG. 1 by AND-gates. The gate outputs of the first group SG1 are connected to the second output OUT2 of the converter. The gate inputs of the second group are connected through the second gate pair GM to the outputs PM of the reference potential source PS. The resistor ladder network L is provided with potential output terminals $H_x$ each of which is connected to a gate input in the first switch group SG1, and with potential input terminals $T_x$ each of which is connected to a gate output in the second switch group SG2, SG1 increasing x-designations being assumed to relate to increasing amplitude values according to the expansion curve.

Figure 2:
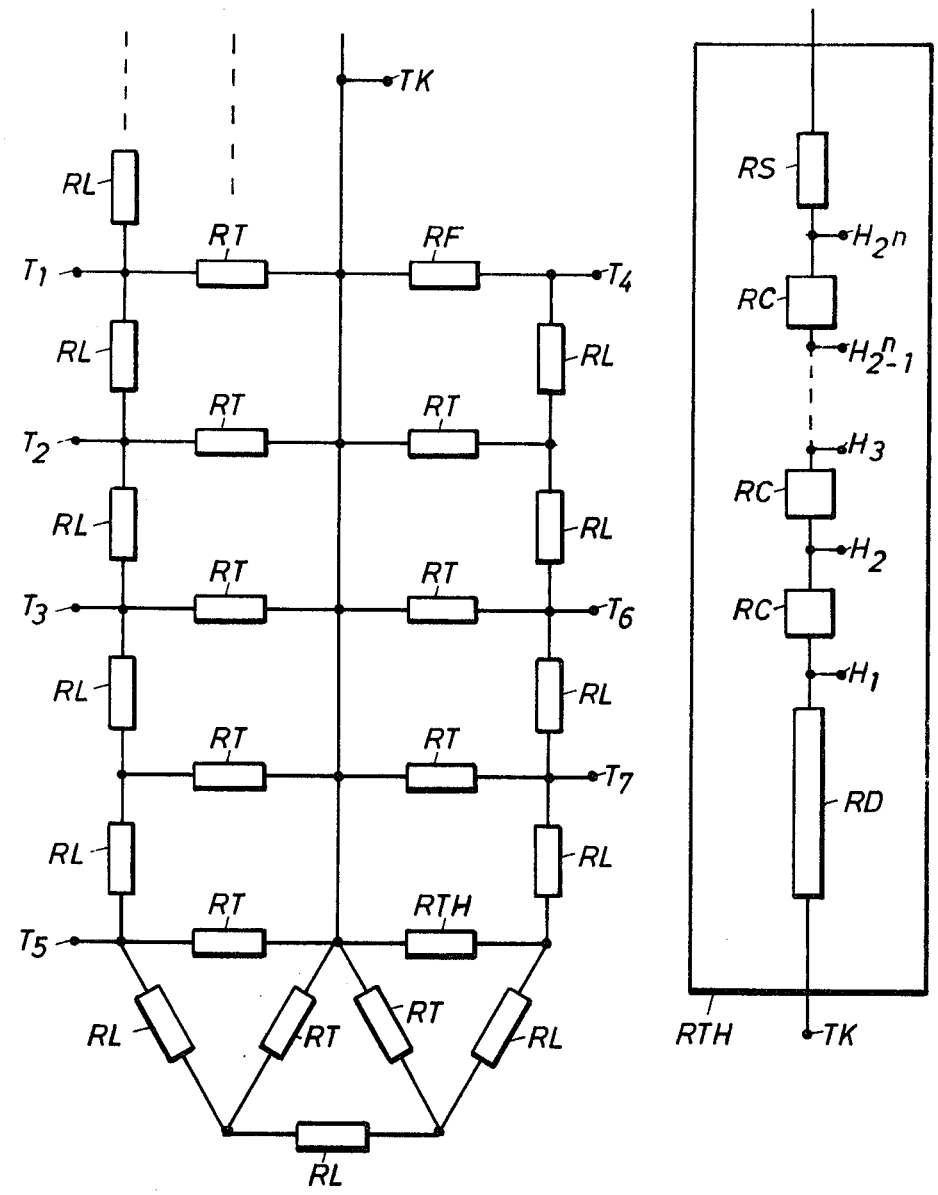
FIGS. 2–4 show a resistor ladder network for a $\mu$-law and an A-law expansion curve.

FIG. 2 shows a ladder network, the one side of which is terminated by a final transverse resistor RF. The ladder consists of equal longitudinal resistors RL and, with the exception of final resistor, equal transverse resistors RT. The first terminals of the transverse resistors are mutually connected to input TK. As is known, an output voltage received through an arbitrary transverse resistor RTH is changed by an expansion factor $e$ if an input voltage is moved between any two transverse resistors which are connected to one of the longitudinal resistors, $RF = RL(e-1)$ and $RT = RL \cdot e(e-1)^2$ being valid for the resistor values. Each of a number of transverse resistors have their second terminals connected to a potential input terminal $T_x$. Furthermore it is known that the input voltage source is loaded with the same resulting resistance value independently of to which input terminal it is connected. To achieve increasing output voltages in correspondance to the increasing number designations of the input terminals, the general rule fulfilled in FIG. 2 is valid, i.e., that the number of longitudinal resistors between the transversal resistor RTH and the input terminals gradually decrease for an increasing number designations. Concerning thi rule, the most practical realizations shown in FIGS. 3 and 4 is a ladder network terminated at both sides, all transverse resistors being connected to the input terminals, the output voltage being obtained through the one final transverse resistor, the input terminal of which is related to the segment containing the highest amplitude values.

According to FIG. 2 said output transverse resistor RTH comprises a series connection of a divider resistor RD which is cconnected to the first terminals of the transverse resistors, and a chain which consists of $2^n - 1$ equal chain resistors RC. The $2^n$ outer and inner terminals of the resistor chain are connected to the potential output terminals $H_x$, the number of chain resistors between the divider resistor and the output terminals gradually increasing for increasing number designations. If $2^n \cdot RC = (e-1)$ RD is valid for the resistance values of the series connection, then two subsequent intervals which belong to different segments are related to the outer terminals of the resistor chain. The sum of the resistance values of the series connection may maximally be the same as the resistance value of the transverse resistor RTH. If the resistance value is less for the series connection than for the transverse resistor such a supplement resistor RS is arranged between the resistor chain and the respective longitudinal resistors that the mutual resistance relation of the resistor ladder remains uninfluenced. In the embodiment for a μ-law and an A-law expansion curve shown in FIG. 3 and FIG. 4, respectively, such output resistor as mentioned above is constituted by a final transverse resistor and due to the expansion factor $e = 2$ the following mutual resistance relation is obtained: $RF = RL$ and $RT = 2 \cdot RL$. For the divider resistor a resistance is chosen $RD = RF/2$, and, consequently, it is determined that the resistanc value of the chain resistors and the supplement resistor is $RC = RS = RF/2^{n+1}$.

Figure 3:
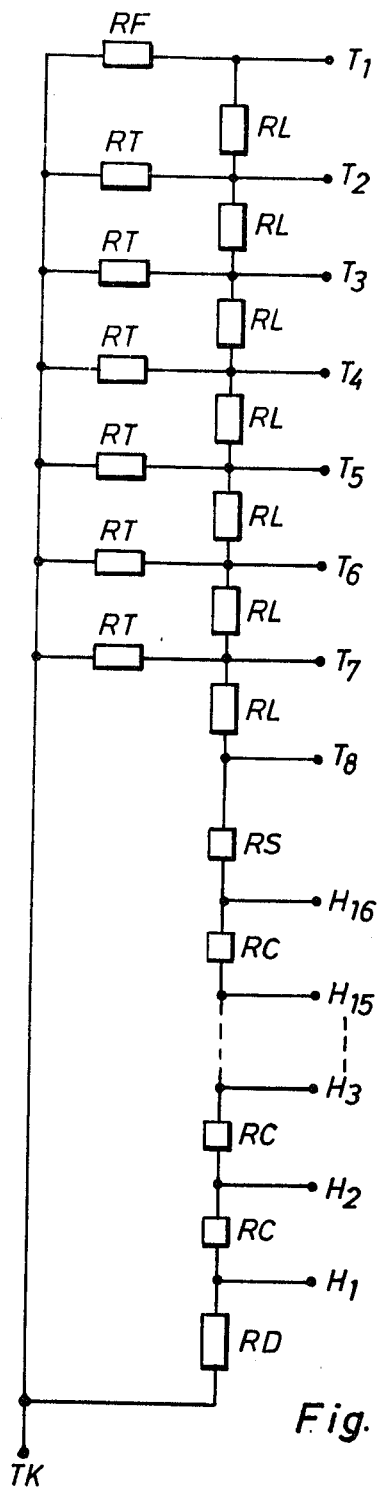

In a digital to analog converter which is provided with a resistor ladder network according to FIGS. 2 and 3 is there obtained the minimum amplitude value between the converter outputs OUT1 and OUT2 if the maximum potential is transferred to the input terminal $T_1$ and if the output OUT2 is connected to the output terminal $H_1$. To displace this minimum amplitude value so that it corresponds to the minimum value prescribed according to the expansion curve the input TK of the resistor ladder is fed with said compensation potential. Even the nonlinearity in the segment with the lowest amplitude values according to a μ-law expansion curve explained in the introduction is achieved with a suitable compensation potential.

Figure 4:
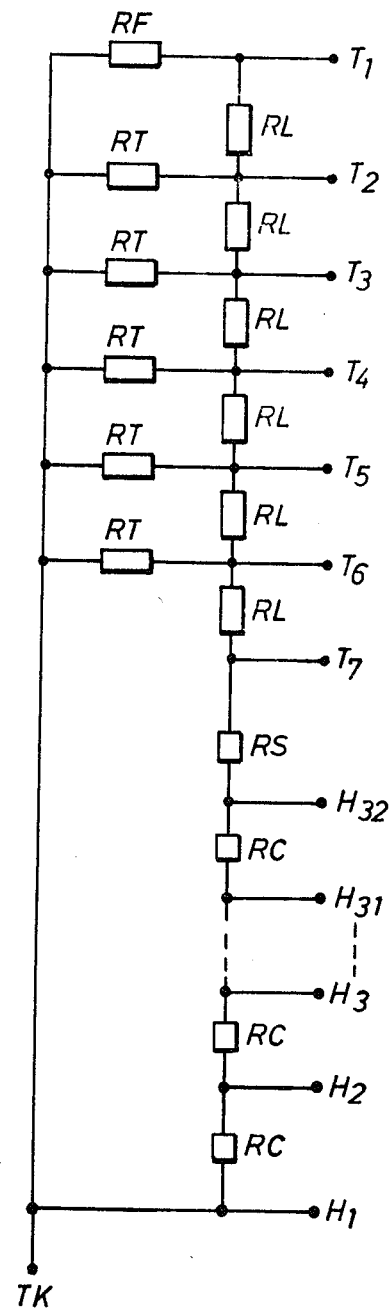

In the ladder network shown in FIG. 4 for an A-law expansion curve the amplitude values are achieved for the segment consisting of 32 intervals, mentioned in the introduction, by making the whole respectiv final transverse resistor as one resistor chain which consists of 32 equal chain resistors $RC = RF/32$ and which is connectedto 32 potential output terminals $H_1$ and $H_{32}$. The terminals $H_1$ to $H_{16}$ are only used for the lowest amplitude values of this expansion curve in combination with a supply of potential to the inpt terminal $T_1$. The terminals $H_{17}$ to $H_{32}$ are used in combination with one of the potential input terminals $T_1$ to $T_7$. In this case the divider resistor is a part of the resistor chain. Consequently no compensation potential is needed and therefore input TK of the ladder network is directly connected to the output GR of the reference potential source to be supplied with said ground potential.

Figure 5:
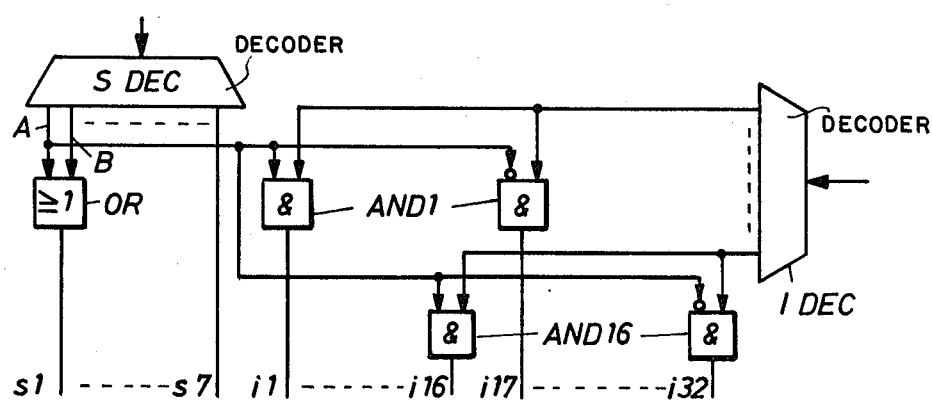
FIG. 5 shows logical circuits for an A-law converter.

FIG. 5 shows logical gates which are included in decoding logic DL of FIG. 1 and with the help of which the 7 segment- and 32 interval-identity signals are generated which are required according to the A-law expansion. In the segment decoder SDEC the outputs A and B, respectively, which are related to the binary contents zero and one, respectively, of said $m$-positions, are connected to an OR-gate OR, on the output of which is obtained the segment-identity signal $s_1$. The other segment-identity signals $s_2$ to $s_7$ are obtained on the other outputs of the segment decoder SDEC. The interval-identity signals $i_1$ to $i_{32}$ are obtained on the outputs of 16 AND-gate pairs AND1 to AND16, each of which having one input connected to output A of the segment decoder and another input to an output of the interval decoder IDEC. Each AND-gate pair is provided with an inverting input so that an activated and unactivated output A, respectively, results in the interval-identity signals $i_1$ to $i_{16}$ and $i_{17}$ to $i_{32}$, respectively.

We claim:

1. A digital to analog converter for converting a received multibit position binary word to a voltage whose amplitude ranges between negative and positive maximum values according to an expansion curve, the expansion curve consisting of a plurality of continuous substantially linear segments with each segment having a plurality of equally divided intervals, and the multibit position binary word having a first field for indicating a desired polarity, a second field for indicating a segment of the curve and a third field for indicating an interval of a segment, said converter comprising:

a converter input for receiving the binary words;

a converter outpt having first and second terminals;

a decoding logic means connected to said converter input for decoding binary words, said decoding logic means having a first decoder means for decoding the first field to produce polarity indicating signals on a first set of decoding logic means outputs, a second decoder means for decoding the second field to produce segment indicating signals on a second set of decoding logic means outputs, and a third decoder means for decoding the third field to produce interval indicating signals on a third set of decoding logic means outputs;

a potential source means including a source of positive and negative voltages having amplitudes directly related to said maximum values, and means connected to said first set of decoding means output terminals for emitting on a first potential-source-means output terminal one of the positive and negative voltages, a source of a compensating voltage for emitting on a second potential-source-means output terminal a compensating voltage whose polarity is determined by the signals on said first set of decoding means output terminals and a source of a reference voltage connected to the first terminal of said converter output;

a group of first switches, each of said first switches having a control input connected to one of the outputs of said second set of outputs, a voltage input connected to said first potential-source means output terminal, and an output terminal;

a group of second switches, each of said second switches having a control input connected to one of the outputs of said third set of outputs, a signal input and an output connected to the second terminal of said converter output; and a resistor ladder network comprising a plurality of serially connected longitudinal resistors, a common bus connected to said second potential-source-means output terminal, a plurality of transverse resistors, each of said longitudinal resistors having the same resistance and each of said transverse resistors having the same resistance, each of said transverse resistors connecting one of the junctions of said longitudinal resistors to said common bus, means for connecting some of the junctions of said longitudinal resistors to an output terminal of one of said first switches, one of said transverse resistors comprising a dividing resistor having one end connected to said common bus, a plurality of serially connected equivalued chain resistors, means for connecting one end of said plurality to the other end of said dividing resistor, means for connecting the other end of said plurality to the associated longitudinal resistor, and means for connecting each of the junctions of the resistors comprising said one transverse resistor to the signal input of one of said second switches.

2. The digital to analog converter according to claim 1 wherein said one transverse resistor is one of the transverse resistors connected to an output of one of said first switches.

3. The digital to analog converter according to claim 1 wherein the ladder network is of the R-2R-type.

* * * * *